US008463227B2

United States Patent
Fortuin

(10) Patent No.: US 8,463,227 B2
(45) Date of Patent: Jun. 11, 2013

(54) RECEIVER FOR AMPLITUDE-MODULATED SIGNALS

(75) Inventor: Rob Fortuin, Eindhoven (NL)

(73) Assignee: NXP B.V., Eindhoven (NL)

( * ) Notice: Subject to any disclaimer, the term of this patent is extended or adjusted under 35 U.S.C. 154(b) by 1223 days.

(21) Appl. No.: 11/995,987

(22) PCT Filed: Jul. 20, 2006

(86) PCT No.: PCT/IB2006/052481
§ 371 (c)(1), (2), (4) Date: Dec. 4, 2008

(87) PCT Pub. No.: WO2007/013004
PCT Pub. Date: Feb. 1, 2007

(65) Prior Publication Data
US 2009/0215417 A1 Aug. 27, 2009

(30) Foreign Application Priority Data
Jul. 25, 2005 (EP) .................................. 05106811

(51) Int. Cl.
*H04B 1/16* (2006.01)
(52) U.S. Cl.
USPC ............................ 455/337; 455/324; 455/339
(58) Field of Classification Search
USPC ........................................................ 455/337
See application file for complete search history.

(56) References Cited

U.S. PATENT DOCUMENTS

| | | | | | |
|---|---|---|---|---|---|
| 4,169,246 | A | * | 9/1979 | Schriber et al. | ............... 375/326 |
| 4,631,499 | A | | 12/1986 | Kasperkovitz | |
| 5,150,384 | A | * | 9/1992 | Cahill | ............................ 375/375 |
| 5,999,802 | A | * | 12/1999 | Aschwanden | ............. 455/196.1 |
| 6,310,513 | B1 | * | 10/2001 | Iemura | ........................... 329/304 |
| 6,631,254 | B1 | * | 10/2003 | Wilson et al. | .................... 455/91 |
| 2004/0005017 | A1 | * | 1/2004 | Borowski et al. | ............. 375/329 |
| 2004/0190647 | A1 | | 9/2004 | Malone et al. | |
| 2005/0111587 | A1 | * | 5/2005 | Abe et al. | ....................... 375/324 |
| 2005/0283264 | A1 | * | 12/2005 | du Breuil | ......................... 700/94 |

FOREIGN PATENT DOCUMENTS

| | | |
|---|---|---|
| CN | 2048977 U | 12/1989 |
| DE | 3938671 A1 | 5/1990 |
| EP | 0184873 A1 | 6/1986 |

OTHER PUBLICATIONS

Office Action in Chinese patent appln. 200680027457.5, with English translation (Mar. 19, 2010).

* cited by examiner

*Primary Examiner* — Ajibola Akinyemi

(57) ABSTRACT

In a receiver, a synchronization circuit (MIX2, C1, R1, VCO) provides a set of oscillator signals (OSI, OSQ, OSX, OSY) that are synchronized with a carrier of an amplitude-modulated signal. The set of oscillator signals (OSI, OSQ, OSX, OSY) comprises a first amplitude-demodulation oscillator signal (OSX) and a second amplitude-demodulation oscillator signal (OSY) that differ in phase. A first amplitude-demodulation mixer (MIX3) mixes the first amplitude-demodulation oscillator signal (OSX) with the amplitude-modulated signal so as to obtain a first amplitude-demodulated signal (MO3). A second amplitude-demodulation mixer (MIX4) mixes the second amplitude-demodulation oscillator signal (OSY) with the amplitude-modulated signal so as to obtain a second amplitude-demodulated signal (MO4). A magnitude comparator (MDT1, MDT2, DDT) compares respective magnitudes (M+, M−) of the first amplitude-demodulated signal (MO3) and the second amplitude-demodulated signal. Accordingly, a phase-error detection signal (IPED) is obtained that varies as a function of a difference between the respective magnitudes (M+, M−) of the first amplitude-demodulated signal (MO3) and the second amplitude-demodulated signal (MO4).

11 Claims, 3 Drawing Sheets

RECEIVER FOR AMPLITUDE-MODULATED SIGNALS

FIELD OF THE INVENTION

An aspect of the invention relates to a receiver for amplitude-modulated signals, such as, for example, television signals. The receiver may be, for example, a conventional television set, a settop box, a digital video recorder, a personal computer or any other multimedia apparatus. Other aspects of the invention relate to a method of controlling a receiver, a computer program product for a receiver, and an audiovisual system.

DESCRIPTION OF PRIOR ART

U.S. Pat. No. 4,631,499 describes a phaselock loop that can be used to generate a synchronous RF carrier in a directly mixing AM receiver. The phaselock loop comprises a phase detection arrangement that reduces an unwanted DC offset generated during phase detection. The phase detection arrangement comprises three cascade-coupled mixer stages. Two of these mixer stages receive an auxiliary mixing signal that has a relatively low frequency.

SUMMARY OF THE INVENTION

According to an aspect of the invention, a receiver has the following characteristics. A synchronization circuit provides a set of oscillator signals that are synchronized with a carrier of an amplitude-modulated signal. The set of oscillator signals comprises a first amplitude-demodulation oscillator signal and a second amplitude-demodulation oscillator signal that differ in phase. A first amplitude-demodulation mixer mixes the first amplitude-demodulation oscillator signal with the amplitude-modulated signal so as to obtain a first amplitude-demodulated signal. A second amplitude-demodulation mixer mixes the second amplitude-demodulation oscillator signal with the amplitude-modulated signal so as to obtain a second amplitude-demodulated signal. A magnitude comparator compares respective magnitudes of the first amplitude-demodulated signal and the second amplitude-demodulated signal. Accordingly, a phase-error detection signal is obtained that varies as a function of a difference between the respective magnitudes of the first amplitude-demodulated signal and the second amplitude-demodulated signal.

The invention takes the following aspects into consideration. Numerous receivers carry out a phase detection by means of a mixer circuit. The mixer circuit mixes a reception signal, which comprises a carrier, with a phase-detection oscillator signal that an oscillator arrangement provides. The mixer circuit provides a direct current signal that varies as a function of a static phase difference between the phase-detection oscillator signal and the carrier. The direct current signal is generally used to control the oscillator arrangement so that the static phase difference has a desired value for which reception quality is optimal.

In practice, a mixer circuit, which is used for phase detection, will provide a parasitic direct current signal in addition to a useful direct current signal that represents a static phase difference. The parasitic direct current signal is often referred to as a direct current offset or simply offset. The useful direct current signal is not distinguishable from the parasitic direct current signal. The parasitic direct current signal will introduce a phase control error in the sense that the static phase difference may be set to a value that is relatively far from a desired value for which reception quality is optimal. Consequently, the parasitic direct current signal, which the mixer circuit provides, adversely affects reception quality unless special measures are taken.

The aforementioned prior art proposes a special measure that prevents a parasitic direct current signal from causing a phase control error. This special measure involves an auxiliary mixing signal that modulates a phase-detection oscillator signal so as to obtain a modulated phase-detection oscillator signal. A mixer circuit mixes the modulated phase-detection oscillator signal with a carrier of a reception signal. The mixer circuit will provide an alternating current signal that is synchronous with the auxiliary mixing signal. This alternating current signal represents a static phase difference and is distinguishable from a parasitic direct current signal that the mixer circuit provides.

The special measure that the aforementioned prior art proposes has various drawbacks. The auxiliary mixing signal will cause a parasitic modulation of oscillator signals other than the phase-detection oscillator signal. These other oscillator signals generally serve to frequency convert a reception signal by mixing the reception signal with these other oscillator signals. The aforementioned parasitic modulation will be copied, as it were, to a frequency-shifted version of the reception signal. This will adversely affect reception quality. Another drawback is that the special measure, which the aforementioned prior art proposes, is relatively complex. A supplementary oscillator arrangement is required to generate the auxiliary mixing signal.

In accordance with the aforementioned aspect of the invention, a magnitude comparator provides a phase-error detection signal that varies as a function of a difference between respective magnitudes of two respective amplitude-demodulated signals. These two respective amplitude-demodulated signals result from two respective mixers that mix two respective amplitude-demodulation oscillator signals, which differ in phase, with an amplitude-modulated reception signal.

Any parasitic direct current signal, which the aforementioned two respective mixers may provide, will not substantially affect the phase-error detection signal. This is because the phase-error detection signal depends on the respective magnitudes of the respective amplitude-demodulated signals, which are alternating current signals. Consequently, a static phase difference can be measured with relatively great precision. What is more, this relatively great precision can be achieved without any auxiliary mixing signal, which may cause parasitic modulation and which may therefore adversely affect reception quality as explained hereinbefore. For those reasons, the invention allows a relatively good reception quality.

Another advantage of the invention relates to the following aspects. As explained hereinbefore, a phase detection in accordance with the invention is relatively insensitive to parasitic direct current signals. This makes the invention particularly suitable for use in direct conversion receivers, which generally suffer from parasitic direct current signals. Direct conversion receivers have various advantages. In a direct conversion receiver, a single oscillator can carry out a frequency conversion as well as a demodulation. In general, each oscillator in a receiver may produce parasitic signals, which may interfere with a desired signal. Since a direct conversion receiver requires relatively few oscillators, there is less risk of interference, which allows a better reception quality. Another advantage is that direct conversion receivers can generally be implemented as an integrated circuit with relatively few external components, which is cost efficient. Since the invention allows direct conversion receivers that are less sensitive to parasitic direct current signals, the invention allows low-cost receiver implementations that provide satisfactory reception quality.

These and other aspects of the invention will be described in greater detail hereinafter with reference to drawings.

DETAILED DESCRIPTION

Figure 1:
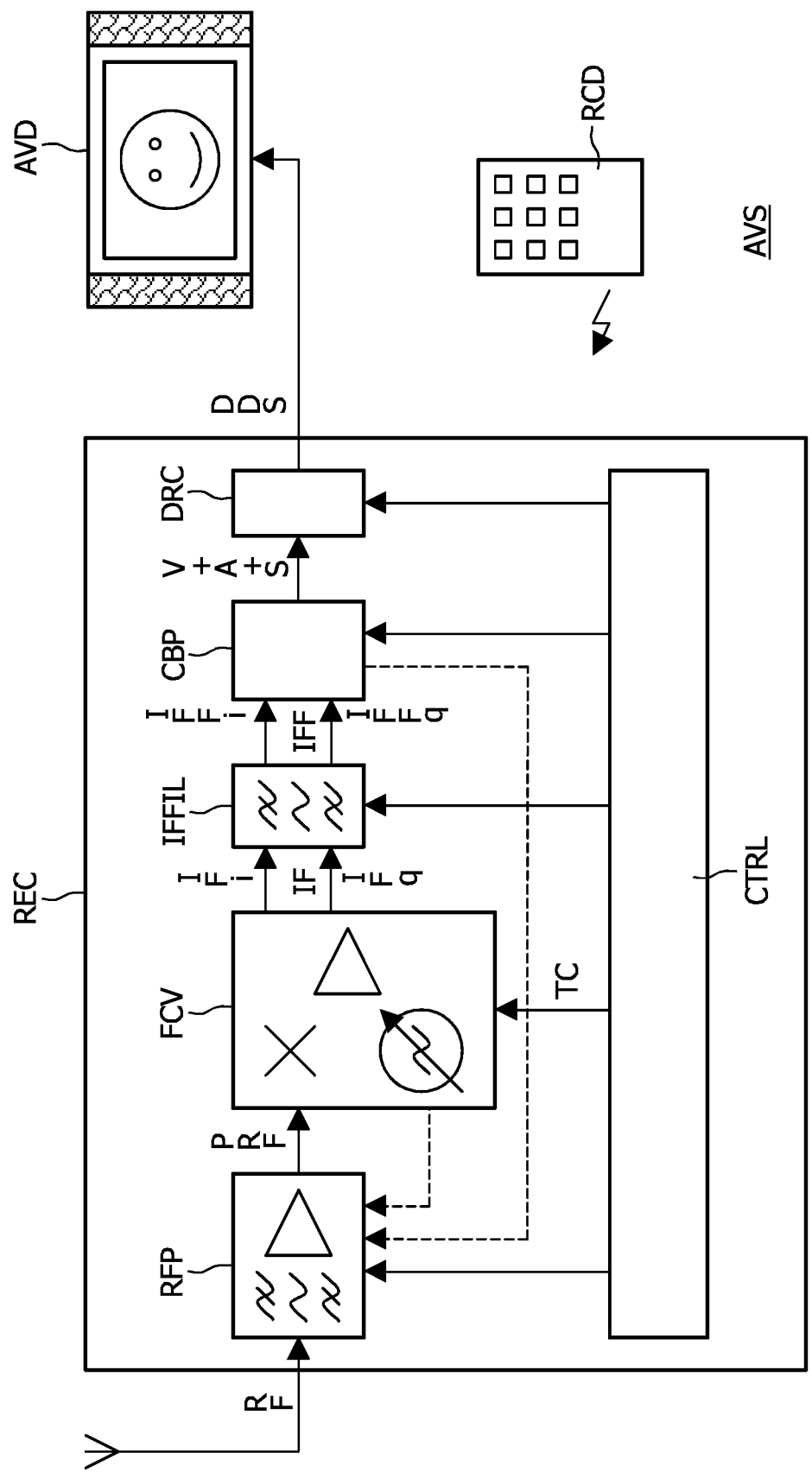
FIG. 1 is a block diagram that illustrates an audiovisual system.

FIG. 1 illustrates an audiovisual system AVS. The audiovisual system AVS comprises a receiver REC, an audiovisual rendering device AVD, and a remote control device RCD. The audiovisual rendering device AVD may be, for example, a flat panel display with stereo loudspeakers. The receiver REC causes the audiovisual rendering device AVD to render an audiovisual signal from a television (TV) station that a user has selected.

The receiver REC comprises a radiofrequency processor RFP, a frequency converter FCV, an intermediate frequency filter IFFIL, a composite baseband processor CBP, a driver circuit DRC, and a controller CTRL. The intermediate frequency filter IFFIL may be a so-called polyphase filter, which allows a frequency response that is asymmetrical with respect to zero (0) frequency. The controller CTRL may be in the form of a suitably programmed microcontroller. The radiofrequency processor RFP and the frequency converter FCV may form part of a single integrated circuit, which may comprise other elements as well. The radiofrequency processor RFP, the frequency converter FCV, the intermediate frequency filter IFFIL, and the composite baseband processor CBP may form part of a single board, which can be plugged into a personal computer or any other multimedia device.

The receiver REC receives a radiofrequency spectrum RF that comprises a plurality of radiofrequency signals, which originate from different television stations. It will be assumed hereinafter that these radiofrequency signals are conventional analog television signals. A conventional analog television signal comprises a picture carrier that is amplitude modulated in an asymmetrical fashion. This type of amplitude modulation is often referred to as vestigial sideband modulation. An analog television signal further comprises a sound carrier, which is in fact an amplitude-modulation component of the picture carrier.

The receiver REC operates as follows. Let it be assumed that the user has selected a television station by means of the remote control device RCD. The remote control device RCD sends a command to the controller CTRL that indicates the television station to be selected. In response, the controller CTRL causes the radiofrequency processor RFP to provide a band pass characteristic that is centered on a radiofrequency signal that originates from the television station, which the user has selected. This radiofrequency signal will be referred to as selected television signal hereinafter. The radiofrequency processor RFP amplifies the selected television signal and attenuates other signals in the radiofrequency spectrum RF, in particular signals that are relatively distant in frequency from the selected television signal. The radiofrequency processor RFP applies a processed radiofrequency spectrum PRF to the frequency converter FCV.

The frequency converter FCV converts the processed radiofrequency spectrum PRF into an intermediate frequency spectrum IF, which has an in phase component IFi and a quadrature component IFq. Such a quadrature representation allows the intermediate frequency spectrum IF to be asymmetrical with respect to zero (0) frequency. The frequency converter FCV carries out a frequency shift. Accordingly, the intermediate frequency spectrum IF comprises a frequency-shifted version of the selected television signal.

The frequency shift, which the frequency converter FCV carries out, is so that the picture carrier of the frequency-shifted version of the selected television signal is at zero (0) frequency. Accordingly, the frequency converter FCV demodulates the selected television signal. The frequency-shifted-version of the selected television signal, which is comprised in the intermediate frequency spectrum IF, represents the amplitude modulation of the picture carrier. The amplitude modulation of the picture carrier is a composite baseband signal, which comprises a video baseband signal, a sound carrier, and synchronization signals.

The controller CTRL causes the frequency converter FCV to carry out this frequency shift by means of a tuning control signal TC, which the controller CTRL applies to the frequency converter FCV. A tracking circuit may provide synchronization between the frequency shift that the frequency converter FCV carries out and the band pass characteristic that the radiofrequency processor RFP provides. In such a case, the controller CTRL indirectly controls the radiofrequency processor RFP, namely via the tracking circuit.

The intermediate frequency filter IFFIL filters the intermediate frequency spectrum IF. The intermediate frequency filter IFFIL provides a band pass characteristic that comprises a Nyquist slope, which is centered on zero (0) frequency. The intermediate frequency filter IFFIL has a bandwidth that corresponds with a typical television signal bandwidth, which may be, for example 6 MHz. The intermediate frequency filter IFFIL provides a filtered intermediate frequency spectrum IFF, which has an in phase component IFFi and a quadrature component IFFq. The filtered intermediate frequency spectrum IFF substantially comprises the aforementioned composite baseband signal of the desired television signal. Any other signal is attenuated to relatively large extent.

The composite baseband processor CBP derives a video signal V, an audio signal A and synchronization signals S from the filtered intermediate frequency spectrum IFF. To that end, the composite baseband processor CBP may carry out various signal processing functions, such as, amplification, clamping, notch filtering, and sound demodulation, comparable to those in a conventional television receiver. In addition, the composite baseband processor CBP may provide a gain control signal for the radiofrequency processor RFP. FIG. 1 illustrates this by means of a broken line, which extends between the composite baseband processor CBP and the radiofrequency processor RFP. The gain control signal is representative of signal levels in the filtered intermediate frequency spectrum IFF.

The driver circuit DRC processes the video signal V, the audio signal A and the synchronization signals S so as to obtain a rendering driver signal DDS, which is suitable for the audiovisual rendering device AVD. To that end, the driver circuit DRC may carry out various signal processing operations, such as, for example, amplification, level shifting, analog-to-digital conversion, bias voltage generation, and synchronization pulse generation.

Figure 2:
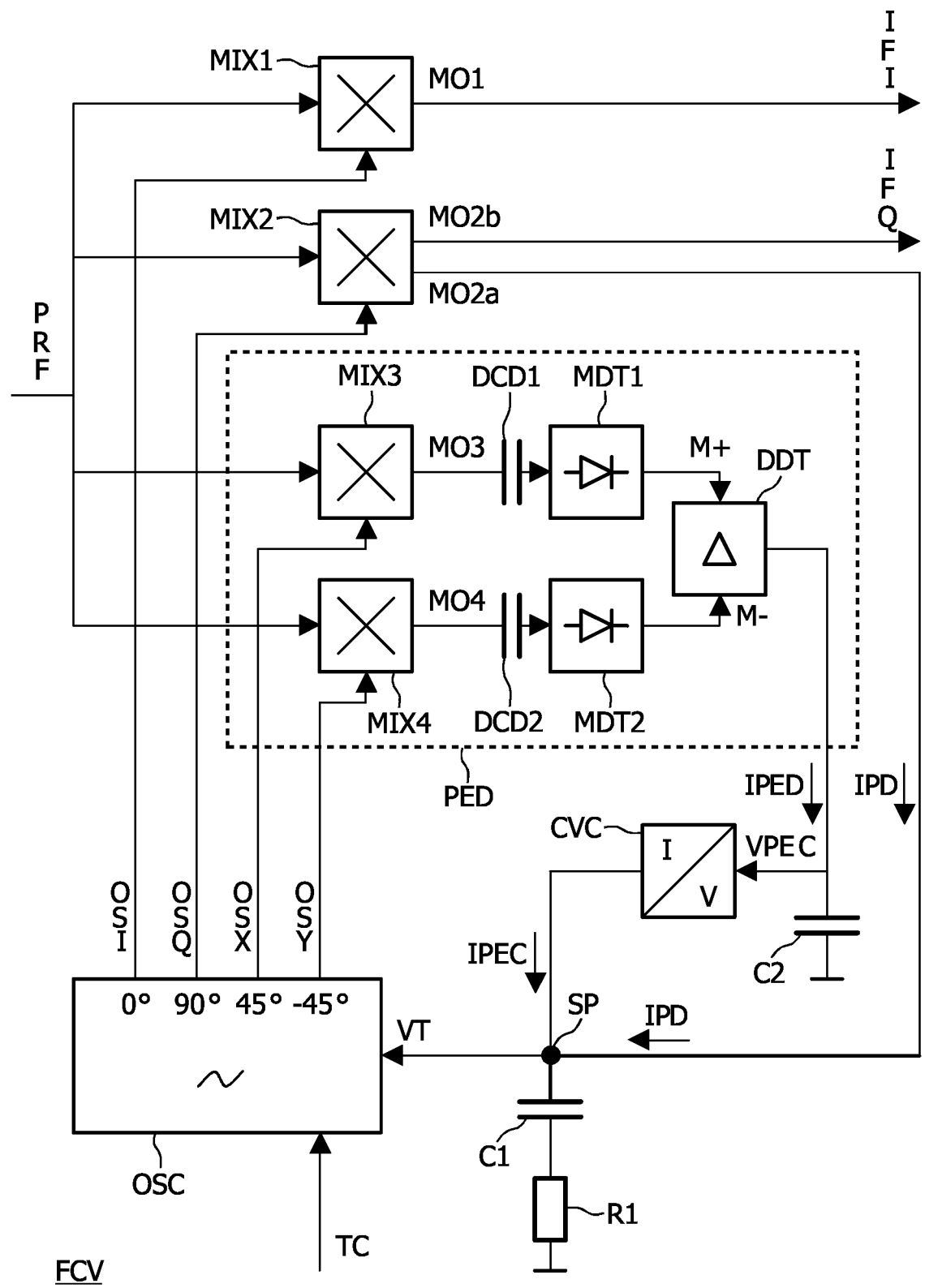
FIG. 2 is a block diagram that illustrates a frequency converter, which forms part of the audiovisual system.

FIG. 2 illustrates the frequency converter FCV. The frequency converter FCV comprises four mixers MIX1, MIX2, MIX3, MIX4, two direct current decouplers DCD1, DCD2, two magnitude detectors MDT1, MDT2, a difference detector DDT, a voltage-to-current converter CVC, two capacitors C1, C2, a resistor R1, and an oscillator arrangement OSC. The four mixers MIX1, MIX2, MIX3, MIX4 are preferably a so-called double-balanced mixers, which have a symmetrical signal output. The two direct current decouplers DCD1, DCD2 may be in the form of, for example, direct-current-decoupling capacitors or a direct current control circuit that has a relatively large time constant. It should be noted that the frequency converter FCV may further comprise two low-pass filters: one coupled between mixer MIX3 and magnitude detector MDT1 and another coupled between mixer MIX4 and magnitude detector MDT2. FIG. 2 does not show these low-pass filters for reasons of conciseness.

The frequency converter FCV operates as follows. The oscillator arrangement OSC provides four oscillator signals: an in-phase oscillator signal OSI, a quadrature oscillator signal OSQ, a phase-leading supplementary oscillator signal OSX, and a phase-lagging supplementary oscillator signal OSY. The four oscillator signals OSI, OSQ, OSX, OSY have the same frequency, but have different phases. The quadrature oscillator signal OSQ leads 90° in phase with respect to the in-phase oscillator signal OSI. The phase-leading supplementary oscillator signal OSX leads 45° in phase with respect to the in-phase oscillator signal OSI. The phase-lagging supplementary oscillator signal OSY lags 45° in phase with respect to the in-phase oscillator signal OSI. The four oscillator signals OSI, OSQ, OSX, OSY may be obtained by means of, for example, a controllable oscillator, which has an oscillation frequency that is four times the frequency of the four oscillator signals OSI, OSQ, OSX, OSY, and various frequency divide-by-two circuits. A frequency division by four can translate, as it were, a 180° phase difference into a 45° phase difference, 45 being equal to 180 divided by 4.

The oscillator arrangement OSC carries out a frequency control in response to the tuning control signal TC from the controller CTRL, which FIG. 1 illustrates. The frequency control causes the frequency of the four oscillator signals OSI, OSQ, OSX, OSY to be in a relatively narrow frequency window centered on the picture carrier of the selected television signal. That is, the frequency control, which the tuning control signal TC defines, brings the frequency of the four oscillator signals OSI, OSQ, OSX, OSY close to that of the picture carrier. The frequency control may be obtained by means of, for example, a programmable frequency counter and various other logic circuits, such as a comparator circuit.

The oscillator arrangement OSC, mixer MIX2, capacitor C1, and the resistor R1 constitute a conventional phaselock loop. This phaselock loop locks onto the picture carrier of the selected television signal. In a phaselock condition, the frequency of the four oscillator signals OSI, OSQ, OSX, OSY is equal to that of the picture carrier of the selected television signal. Mixer MIX2, which mixes the processed radiofrequency spectrum PRF with the quadrature oscillator signal OSQ, constitutes a phase detector. Mixer MIX2 provides two mixer output signals. Mixer output signal MO2a is a phase detection current IPD that varies as a function of a phase difference between the quadrature oscillator signal OSQ and the picture carrier of the selected television signal. The phase detection current IPD flows through a series connection of capacitor C1 and the resistor R1, which constitutes a loop filter. This loop filter provides a tuning voltage VT, which the oscillator arrangement OSC receives. The frequency of the four oscillator signals OSI, OSQ, OSX, OSY varies as a function of the tuning voltage VT.

In the phaselock condition, there will be a static phase difference between the quadrature oscillator signal OSQ and the picture carrier of the selected television signal. Ideally, the static phase difference should exactly be 90°, which means that there is a perfect phase quadrature relationship between the quadrature oscillator signal OSQ and the picture carrier of the selected television signal. There is no quadrature phase error. In that case, the phase detection current IPD will be free of any component that represents an amplitude modulation of the picture carrier of the selected television signal. Stated boldly, mixer MIX2 behaves as a pure phase detector if there is no quadrature phase error.

Let it be assumed that the aforementioned static phase difference is not exactly 90°. There is a quadrature phase error. For example, the static phase difference may be 89° instead of 90°, which means that the quadrature phase error is 1°. In that case, mixer MIX2 behaves as a combination of a phase detector and an amplitude detector. The phase detection current IPD will comprise a component that represents the amplitude modulation of the picture carrier. This component will cause a parasitic phase modulation of the four oscillator signals OSI, OSQ, OSX, OSY.

Mixer MIX1 and mixer MIX2 mix the processed radiofrequency spectrum PRF with the in-phase oscillator signal OSI and the quadrature oscillator signal OSQ, respectively. Mixer MIX1 provides mixer output signal MO1, which constitutes the in phase component IFi of the intermediate frequency spectrum IF. Mixer MIX2 provides mixer output signal MO2b in addition to mixer output signal MO2a, which constitutes the phase detection current IPD mentioned hereinbefore. Mixer output signal MO2b constitutes the quadrature component IFq of the intermediate frequency spectrum IF.

It has been explained hereinbefore that the four oscillator signals OSI, OSQ, OSX, OSY may comprise a parasitic phase modulation if there is a quadrature phase error. Mixer MIX1 and mixer MIX2 mix the selected television signal with the in-phase oscillator signal OSI and the quadrature oscillator signal OSQ, respectively. As a result, the parasitic phase modulation will be copied, as it were, to the sound carrier of the frequency-shifted version of the selected television signal. The sound carrier will thus have a parasitic phase modulation, which represents the amplitude modulation of the picture carrier. This parasitic modulation will cause interference in the audio signal A that the composite baseband processor CBP provides.

Mixer MIX3, mixer MIX4, the two direct current decouplers DCD1, DCD2, the two magnitude detectors MDT1, MDT2, and the difference detector DDT constitute a phase error detector PED, which FIG. 2 illustrates by means of a rectangle in broken lines. Mixer MIX3 mixes the processed radiofrequency spectrum PRF with the phase-leading supplementary oscillator signal OSX. Mixer MIX3 provides mixer output signal MO3. Mixer MIX4 mixes the processed radiofrequency spectrum PRF with the phase-lagging supplementary oscillator signal OSY. Mixer MIX provides mixer output signal MO4.

In the phaselock condition, mixer MIX3 and mixer MIX4 constitute amplitude detectors. Mixer output signal MO3 and mixer output signal MO4 both represent an amplitude modulation of the picture carrier. Mixer output signal MO3 has a magnitude that depends on a static phase difference between the phase-leading supplementary oscillator signal OSX and the picture carrier of the selected television signal. This static phase difference will be referred to hereinafter as phase-leading static phase difference. Mixer output signal MO3 may mathematically be expressed as follows:

$$MO3 = k_3 A(t) \cos \Delta\phi_+$$

In this mathematical expression, $k_3$ represents a gain factor of mixer MIX3, A(t) represents the amplitude modulation of the picture carrier, and $\Delta\phi_+$ represents the phase-leading static phase difference.

Mixer output signal MO4 has a magnitude that depends on a static phase difference between the phase-lagging supplementary oscillator signal OSY and the picture carrier. This static phase difference will be referred to hereinafter as phase-lagging static phase difference. Mixer output signal MO4 may mathematically be expressed as follows:

$$MO4 = k_4 A(t) \cos \Delta\phi_-$$

In this mathematical expression, $k_4$ represents a gain factor of mixer MIX4, A(t) represents the amplitude modulation of the picture carrier, and Awn represents the phase-lagging static phase difference.

Magnitude detector MDT1 receives mixer output signal MO3 via direct current decoupler DCD1. Magnitude detector MDT2 receives mixer output signal MO4 via direct current decoupler DCD2. The two direct current decouplers DCD1, DCD2 remove any direct current component that may be present in the aforementioned mixer output signals MO3, MO4.

Magnitude detector MDT1 provides a phase-leading magnitude detection signal M+ that represents the magnitude of mixer output signal MO3. The phase-leading magnitude detection signal M+ varies proportionally with the cosine of the phase-leading static phase difference. This may mathematically be expressed as follows:

$$M+ \propto \cos \Delta\phi_+$$

Magnitude detector MDT provides a phase-lagging magnitude detection signal M– that is representative of the magnitude of mixer output signal MO4. The phase-lagging magnitude detection signal M– varies proportionally with the cosine of the phase-lagging static phase difference. This may mathematically be expressed as follows:

$$M- \propto \cos \Delta\phi_-$$

The difference detector DDT compares the phase-leading magnitude detection signal M+ with the phase-lagging magnitude detection signal M–. The difference detector DDT provides a phase-error detection current IPED that varies as a function of a difference between the magnitude of mixer output signal MO3 and mixer output signal MO4. The phase-error detection current IPED is zero (0) if the aforementioned respective magnitudes are equal.

Figure 3A:
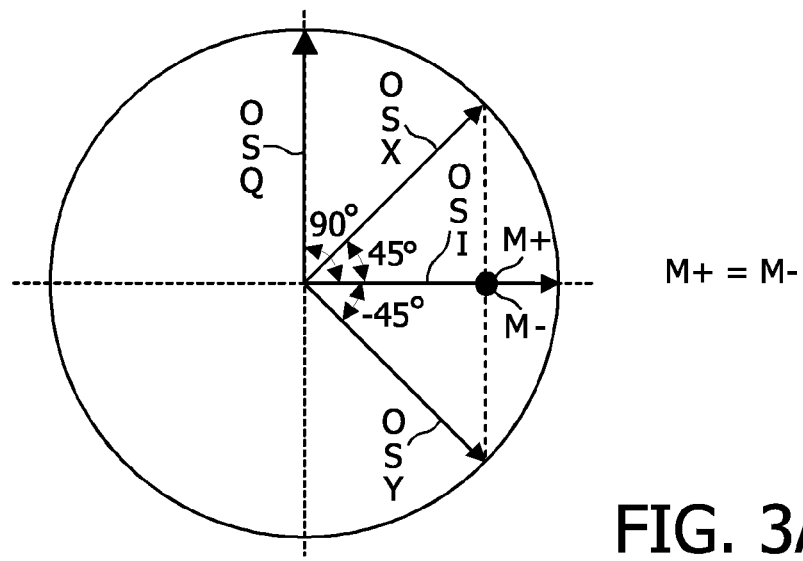
FIGS. 3A, 3B, 3C are phase diagrams that illustrate an offset-free detection of three different phase errors.
Figure 3B:
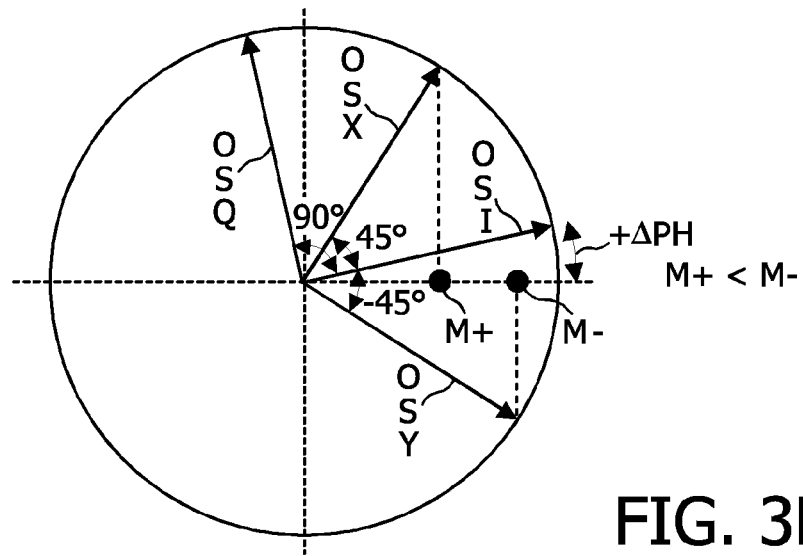
Figure 3C:
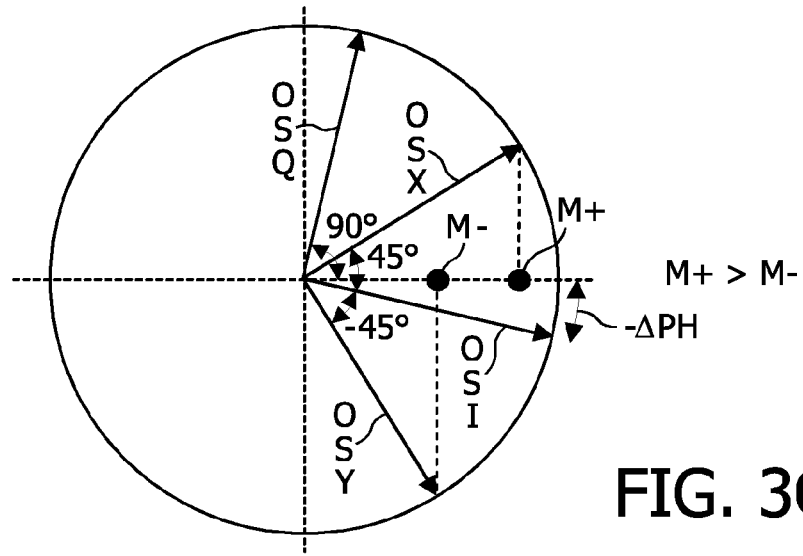

FIGS. 3A, 3B, and 3C illustrate respective phase error detections, which the phase error detector PED carries out. These respective phase error detections concern different phase conditions. FIG. 3A is a phase diagram that comprises a coordinate system with a horizontal axis and a vertical axis, which cross each other at an origin. An arrow represents a signal. Such an arrow has an angle with respect to a right half of the horizontal axis, which is right from the origin. The angle represents a phase difference between the signal concerned and the picture carrier of the selected television signal. The picture carrier of the selected television signal thus corresponds with the right half of the horizontal axis. FIG. 3A comprises four arrows: one that represents the in-phase oscillator signal OSI, one that represents the quadrature oscillator signal OSQ, one that represents the phase-leading supplementary oscillator signal OSX, and one that represents the phase-lagging supplementary oscillator signal OSY. The aforementioned equally applies to FIGS. 3B and 3C.

FIG. 3A illustrates a desired phase condition. There is no phase difference between the in-phase oscillator signal OSI and the picture carrier of the selected television signal. Consequently, the phase difference between the quadrature oscillator signal OSQ and the picture carrier is exactly 90°. There is no quadrature phase error.

In the desired phase condition, the phase-leading static phase difference is exactly 45° and the phase-lagging static phase difference is exactly –45°. As a result, mixer output signal MO3 and mixer output signal MO4 have the same magnitude: $\cos \Delta\phi_+ = \cos \Delta\phi_- = 0.707$. Consequently, the phase-leading detection signal and the phase-lagging detection signal are equal: M+=M–. FIG. 3A illustrates this by means of two vertical dotted lines. One vertical dotted line corresponds with an x-coordinate of the arrow that represents the phase-leading supplementary oscillator signal OSX. The phase-leading detection signal varies proportionally with this x-coordinate, which corresponds with the term $\cos \Delta\phi_+$ in the mathematical expressions presented hereinbefore. The other dotted line represents an x-coordinate of the arrow that represents the phase-lagging supplementary oscillator signal OSY. The phase-lagging detection signal varies proportionally with this x-coordinate, which corresponds with the term $\cos \Delta\phi_-$ in the mathematical expressions presented hereinbefore. The aforementioned x-coordinates are the same.

FIG. 3B illustrates a positive phase error condition. There is a positive phase difference +ΔPH between the in-phase oscillator signal OSI and the picture carrier of the selected television signal. Consequently, the phase difference between the quadrature oscillator signal OSQ and the picture carrier is equal to 90°+ΔPH. The quadrature phase error is equal to the positive phase difference +ΔPH.

In the positive phase error phase condition, the phase-leading static phase difference is 45°+ΔPH and the phase-lagging static phase difference is –45°+ΔPH. As a result, mixer output signal MO4 has a greater magnitude than mixer output signal MO3: $\cos \Delta\phi_+ < \cos \Delta\phi_-$. Consequently, the phase-leading detection signal is smaller than the phase-lagging detection signal: M+<M–. FIG. 3B illustrates this by means of two vertical dotted lines in a fashion similar to that in FIG. 3A.

FIG. 3C illustrates a negative phase error condition. There is a negative phase difference –ΔPH between the in-phase oscillator signal OSI and the picture carrier of the selected television signal. Consequently, the phase difference between the quadrature oscillator signal OSQ and the picture carrier is equal to 90°–ΔPH. The quadrature phase error is equal to the negative phase difference –ΔPH.

In the negative phase error phase condition, the phase-leading static phase difference is 45°–ΔPH and the phase-lagging static phase difference is –45°–ΔPH. As a result, mixer output signal MO3 has a greater magnitude than mixer output signal MO4: $\cos \Delta\phi_+ > \cos \Delta\phi_-$. Consequently, the phase-leading detection signal is larger than the phase-lagging detection signal: M+>M–. FIG. 3C illustrates this by means of two vertical dotted lines in a fashion similar to that in FIGS. 3A and 3B.

The phase-error detection current IPED, which the phase error detector PED provides, varies as a function of the quadrature phase error. The phase-error detection current IPED is zero (0) if there is no quadrature phase error because, in that case, mixer output signal MO3 and mixer output signal MO4 have the same magnitude. This corresponds with the desired phase condition, which FIG. 3A illustrates. The phase-error detection current IPED has a sign that depends on whether the quadrature phase error is positive or negative. For example, let it be assumed that the phase-error detection current IPED has a positive sign if the quadrature phase error is positive as FIG. 3B illustrates. In that case, the phase-error detection current IPED will have a negative sign if the quadrature phase error is negative as FIG. 3C illustrates.

The phase error detector PED, which FIG. 2 illustrates, applies the phase-error detection current IPED to capacitor C2. Capacitor C2 provides a phase-error correction voltage VPEC, which is an integral of the phase-error detection current IPED. The phase-error correction voltage VPEC increases or decreases depending on whether the phase-error detection current IPED charges or decharges capacitor C2. The voltage-to-current converter CVC converts the phase-error correction voltage VPEC into a phase-error correction current IPEC. The phase-error correction current IPEC is added to the phase detection current IPD at a summing point SP. The series connection of capacitor C1 and the resistor R1 receives a sum of the phase detection current IPD and the phase-error correction current IPEC.

In the phaselock condition, the tuning voltage VT has a value that causes the frequency of the four oscillator signals OSI, OSQ, OSX, OSY to be equal to that of the picture carrier of the desired television signal. The tuning voltage VT will therefore be substantially constant. This means that, the sum of the phase detection current IPD and the phase-error correction current IPEC is substantially equal to zero (0) in the phaselock condition. Capacitor C1 is neither charged nor decharged so that the tuning voltage VT remains constant.

Let it be assumed that the phase-error correction current IPEC is absent, which means that this current is equal to zero (0). In that case, the phase detection current IPD, which mixer MIX2 provides, will be zero (0) in the phaselock condition. Ideally, the phase detection current IPD is exactly zero (0) if there is no phase quadrature error. In that case, there will be no phase quadrature error in the phaselock condition. In practice, the phase detection current IPD will have a so-called offset value if there is no phase quadrature error. Consequently, a certain phase quadrature error is needed to make the phase detection current IPD equal to zero (0). Since the phase detection signal is zero (0) in the phaselock condition, there will be a phase quadrature error due to the offset value in the phase detection current IPD. The offset value introduces a phase quadrature error, which causes interference in the audio signal A.

The phase error detector PED compensates for the offset value in the phase detection current IPD. In the phaselock condition, the sum of the phase detection current IPD and the phase-error detection current IPED is substantially equal to zero (0) as explained hereinbefore. The phase detection current IPD has a particular value, which is substantially constant because the phase difference between the quadrature oscillator signal OSQ and the picture carrier of the selected television signal is substantially constant in the phaselock condition. Consequently, the phase-error correction current IPEC is substantially constant in the phaselock condition because this current cancels, as it were, the phase detection current IPD, which is substantially constant.

The phase-error correction current IPEC can be substantially constant only if the phase-error detection current IPED, which the phase error detector PED provides, is substantially equal to zero (0). Otherwise, capacitor C2 would be charged or decharged, which would cause a change in the phase-error correction current IPEC. The phase detection current IPD is substantially equal to zero if there is no quadrature error as explained hereinbefore with reference to FIGS. 3A, 3B, and 3C. Any phase quadrature error will cause the phase error detector PED to charge or decharge capacitor C2, which will cause a frequency shift and, therefore, a phase shift in the four oscillator signals OSI, OSQ, OSX, OSY. This will change the phase condition so that the phase quadrature error becomes substantially zero (0), which is a steady state condition.

The phase error detector PED enforces, as it were, the desired phase condition, which FIG. 3A illustrates. The phase error detector PED thus ensures that the sound signal, which the composite baseband processor CBP illustrated in FIG. 1 provides, is substantially free of any parasitic component that represents the amplitude modulation of the picture carrier of the selected television signal.

Concluding Remarks

The detailed description hereinbefore with reference to the drawings illustrates the following characteristics, which are cited in various independent claims. In a receiver, a synchronization circuit (MIX2, C1, R1, VCO) provides a set of oscillator signals (OSI, OSQ, OSX, OSY) that are synchronized with a carrier of an amplitude-modulated signal. The set of oscillator signals (OSI, OSQ, OSX, OSY) comprises a first amplitude-demodulation oscillator signal (OSX) and a second amplitude-demodulation oscillator signal (OSY) that differ in phase. A first amplitude-demodulation mixer (MIX3) mixes the first amplitude-demodulation oscillator signal (OSX) with the amplitude-modulated signal so as to obtain a first amplitude-demodulated signal (MO3). A second amplitude-demodulation mixer (MIX4) mixes the second amplitude-demodulation oscillator signal (OSY) with the amplitude-modulated signal so as to obtain a second amplitude-demodulated signal (MO4). The respective magnitudes (M+, M−) of the first amplitude-demodulated signal (MO3) and the second amplitude-demodulated signal are compared so as to obtain a phase-error detection signal (IPED) that varies as a function of a difference between the respective magnitudes (M+, M−) of the first amplitude-demodulated signal (MO3) and the second amplitude-demodulated signal (MO4).

The detailed description hereinbefore further illustrates various optional characteristics, which are cited in the dependent claims. These characteristics may be applied to advantage in combination with the aforementioned characteristics. Various optional characteristics are highlighted in the following paragraphs. Each paragraph corresponds with a particular dependent claim.

The set of oscillator signals (OSI, OSQ, OSX, OSY) comprises an in-phase oscillator signal (OSI), which has substantially the same phase as the carrier of the amplitude-modulated signal. The first amplitude-demodulation oscillator signal (OSX) and the second amplitude-demodulation oscillator signal (OSY) have a phase difference with respect to the in-phase oscillator signal (OSI) that is substantially equal to +45° and −45°, respectively. Such an +45°/−45° phase relationship further contributes to relatively good reception quality for the following reasons. A static phase error variation will cause a relatively great variation in the respective magnitudes of the respective amplitude-demodulated signals. Consequently, the phase-error detection signal will vary to relatively great extent in response to a static phase error variation. A phase error detection in accordance with the invention, will therefore be relatively sensitive if the +45°/−45° phase relationship is applied. This can also be understood on the basis of FIGS. 3A-3C. A sensitive phase error detection allows an accurate phase control, which allows a close approximation of an optimum phase relationship between the carrier of the modulated signal and the set of oscillator signals.

A phase-error correction path (C2, CVC) is coupled between the magnitude comparator (MDT1, MDT2, DDT) and a frequency-control point (SP) in the synchronization circuit (MIX2, C1, R1, VCO). The set of oscillator signals (OSI, OSQ, OSX, OSY) have a frequency that varies as a function of a signal at the frequency-control point (SP). The phase-error correction path (C2, CVC) applies a phase-error correction signal (IPEC) to the frequency-control point (SP) in response to the phase-error detection signal (IPED), which the magnitude comparator (MDT1, MDT2, DDT) provides. This further contributes to relatively good reception quality because a parasitic direct current signal, which may be present in a phase detection signal within the synchronization circuit, can be compensated for.

The phase-error correction path (C2, CVC) comprises an integrating circuit (C2) so that the phase-error correction signal (IPEC) at the frequency-control point (SP) is an integral of the phase-error detection signal (IPED), which the magnitude comparator (MDT1, MDT2, DDT) provides. This further contributes to relatively good reception quality because a substantially full compensation of parasitic direct current signal can be achieved with such an integrating phase-error correction path. The phase-error detection signal, which results from the static phase error detection in accordance with the invention, will dominate, as it were in terms of controlling the static phase difference.

The synchronization circuit (MIX2, C1, R1, VCO) comprises a phase-detection mixer (MIX2) for mixing the amplitude-modulated signal with a quadrature oscillator signal (OSQ), which is substantially 90° phase shifted with respect to the carrier of the amplitude-modulated signal. Accordingly, a phase-detection signal (IPD) is obtained. The phase-detection mixer (MIX2) applies the phase-detection signal (IPD) to the frequency-control point (SP). This allows cost-efficient implementations.

The aforementioned characteristics can be implemented in numerous different manners. In order to illustrate this, some alternatives are briefly indicated.

The aforementioned characteristics may be implemented to advantage in any type of receiver. A receiver for conventional analog television signals is merely an example. The aforementioned characteristics may equally be implemented in, for example, a receiver for digital communication signals. All what matters is that a reception signal comprises some form of amplitude modulation. It should further be noted that a phase-error correction in accordance with the invention can equally be implemented in receivers other than direct conversion receivers, such as, for example, superheterodyne receivers. The phase-error correction may then apply to a phaselock loop demodulator rather than to a frequency converter.

The phase-error detection signal, which is obtained in accordance with the invention, need not necessarily be injected into the synchronization circuit. The phase-error detection signal may be used, for example, for measurement purposes only.

The respective amplitude-demodulation oscillator signals may have a phase relationship that is different from the aforementioned +45°/−45° phase relationship. For example, the first amplitude-demodulation oscillator signal may have a 30° phase lead with respect to the in-phase oscillator signal. The second amplitude-demodulation oscillator signal may have a 30° phase lag with respect to the in-phase oscillator signal. As explained hereinbefore, the static phase error detection will be less sensitive than with a +45°/−45° phase relationship. Nevertheless, a satisfactory static phase error detection may still be possible. This can also be understood on the basis of FIGS. 3A-3C.

It should further be noted that the respective amplitude-demodulation oscillator signals need not necessarily have a phase relationship that is symmetrical with respect to the in-phase oscillator signal. For example, the first amplitude-demodulation oscillator signal may have a 60° phase lead with respect to the in-phase oscillator signal, whereas the second amplitude-demodulation oscillator signal may have a 30° phase lag. The respective amplitude demodulation mixers may have different gains in order to compensate for such an asymmetrical phase relationship. There are numerous suitable phase-gain combinations.

The phase-error correction path, which is optional, may be implemented in numerous different fashions. FIG. 2 merely illustrates an example, in which capacitor C2 and voltage-to-current converter CVC form the phase-error correction path. Capacitor C2 may be replaced by an operational amplifier that is provided with a feedback capacitor. As another example, it is possible to omit capacitor C2 and to replace the voltage-to-current converter CVC by a direct current amplifier that has a relatively high gain. Still referring to FIG. 2, the oscillator arrangement OSC may comprise an additional frequency control input. In that case, the phase-error correction voltage VPEC can be applied to the additional frequency control input and the voltage-to-current converter CVC can be omitted. In such a variant, the additional frequency control input constitutes the frequency control point mentioned hereinbefore.

There are numerous manners to compare the respective magnitudes of the first amplitude-demodulated signal and the second amplitude-demodulated signal. FIG. 2 merely illustrates an example. As another example, the respective amplitude-demodulated signals may be applied to an analog-to-digital converter, which provides respective digital sample streams that represents the respective amplitude-demodulated signals. A suitably programmed processor may derive the phase-error detection signal from the respective digital sample streams. A processor can be suitably programmed by means of a computer program product, which comprises a set of instructions that causes the processor to carry out a magnitude comparison so as to obtain the phase-error detection signal in accordance with the invention.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:
1. A receiver comprising:
   a synchronization circuit arranged to provide a set of oscillator signals that are synchronized with a carrier of an amplitude-modulated signal, the set of oscillator signals comprising a first amplitude-demodulation oscillator signal and a second amplitude-demodulation oscillator signal that differ in phase;
   a first amplitude-demodulation mixer for mixing the first amplitude-demodulation oscillator signal with the amplitude-modulated signal so as to obtain a first amplitude-demodulated signal;

a second amplitude-demodulation mixer for mixing the second amplitude-demodulation oscillator signal with the amplitude-modulated signal so as to obtain a second amplitude-demodulated signal;

a magnitude comparator arranged to compare respective magnitudes of the first amplitude-demodulated signal and the second amplitude-demodulated signal so as to obtain a phase-error detection signal that varies as a function of a difference between the respective magnitudes of the first amplitude-demodulated signal and the second amplitude-demodulated signal; and a phase-error correction path that is coupled between the magnitude comparator and a frequency-control point in the synchronization circuit, the set of oscillator signals having a frequency that varies as a function of a signal at the frequency-control point.

2. A receiver according to claim 1, the set of oscillator signals comprising an in-phase oscillator signal, which has substantially the same phase as the carrier of the amplitude-modulated signal, the first amplitude-demodulation oscillator signal and the second amplitude-demodulation oscillator signal having a phase difference with respect to the in-phase oscillator signal that is substantially equal to +45° and −45°, respectively.

3. A receiver according to claim 1, the phase-error correction path being arranged to apply a phase-error correction signal to the frequency-control point in response to the phase-error detection signal, which the magnitude comparator provides.

4. A receiver according to claim 3, the phase-error correction path comprising an integrating circuit so that the phase-error correction signal at the frequency-control point is an integral of the phase-error detection signal, which the magnitude comparator provides.

5. A receiver according to claim 3, the synchronization circuit comprising a phase-detection mixer for mixing the amplitude-modulated signal with a quadrature oscillator signal, which is substantially 90° phase shifted with respect to the carrier of the amplitude-modulated signal, so as to obtain a phase-detection signal, the phase-detection mixer being coupled to apply the phase-detection signal to the frequency-control point.

6. An audiovisual system comprising a receiver according to claim 1 and an audiovisual rendering device for rendering a signal that the receiver has derived from a reception signal.

7. A method of detecting a phase error in a receiver comprising:
a synchronization circuit arranged to provide a set of oscillator signals that are synchronized with a carrier of an amplitude-modulated signal, the set of oscillator signals comprising a first amplitude-demodulation oscillator signal and a second amplitude-demodulation oscillator signal that differ in phase;
a first amplitude-demodulation mixer for mixing the first amplitude-demodulation oscillator signal with the amplitude-modulated signal so as to obtain a first amplitude-demodulated signal; and
a second amplitude-demodulation mixer for mixing the second amplitude-demodulation oscillator signal with the amplitude-modulated signal so as to obtain a second amplitude-demodulated signal,
the method comprising:
a magnitude comparison step in which respective magnitudes of the first amplitude-demodulated signal and the second amplitude-demodulated signal are compared so as to obtain a phase-error detection signal that varies as a function of a difference between the respective magnitudes of the first amplitude-demodulated signal and the second amplitude-demodulated signal, wherein the magnitude comparison step is executed using a magnitude comparator, wherein a phase-error correction path is coupled between the magnitude comparator and a frequency-control point in the synchronization circuit, the set of oscillator signals having a frequency that varies as a function of a signal at the frequency-control point.

8. The method of claim 7, the phase-error correction path being arranged to apply a phase-error correction signal to the frequency-control point in response to the phase-error detection signal, which the magnitude comparator provides.

9. The method of claim 8, the phase-error correction path comprising an integrating circuit so that the phase-error correction signal at the frequency-control point is an integral of the phase-error detection signal, which the magnitude comparator provides.

10. The method of claim 8, the synchronization circuit comprising a phase-detection mixer for mixing the amplitude-modulated signal with a quadrature oscillator signal, which is substantially 90° phase shifted with respect to the carrier of the amplitude-modulated signal, so as to obtain a phase-detection signal, the phase-detection mixer being coupled to apply the phase-detection signal to the frequency-control point.

11. A non transitory computer readable storage medium for a receiver comprising:
a synchronization circuit arranged to provide a set of oscillator signals that are synchronized with a carrier of an amplitude-modulated signal, the set of oscillator signals comprising a first amplitude-demodulation oscillator signal and a second amplitude-demodulation oscillator signal that differ in phase;
a first amplitude-demodulation mixer for mixing the first amplitude-demodulation oscillator signal with the amplitude-modulated signal so as to obtain a first amplitude-demodulated signal; and
a second amplitude-demodulation mixer for mixing the second amplitude-demodulation oscillator signal with the amplitude-modulated signal so as to obtain a second amplitude-demodulated signal,
wherein the computer readable storage medium stores a computer program product comprising a set of instructions that, when loaded into the receiver, causes the receiver to carry out a magnitude comparison step in which respective magnitudes of the first amplitude-demodulated signal and the second amplitude-demodulated signal are compared so as to obtain a phase-error detection signal that varies as a function of a difference between the respective magnitudes of the first amplitude-demodulated signal and the second amplitude-demodulated signal, wherein the magnitude comparison step is executed using a magnitude comparator, wherein a phase-error correction path is coupled between the magnitude comparator and a frequency-control point in the synchronization circuit, the set of oscillator signals having a frequency that varies as a function of a signal at the frequency-control point.

* * * * *